(12) United States Patent
Endo et al.

(10) Patent No.: US 9,195,137 B2
(45) Date of Patent: Nov. 24, 2015

(54) COMPOSITION FOR FORMING HIGHLY ADHESIVE RESIST UNDERLAYER FILM

(71) Applicant: NISSAN CHEMICAL INDUSTRIES, LTD., Tokyo (JP)

(72) Inventors: Takafumi Endo, Toyama (JP); Rikimaru Sakamoto, Toyama (JP); Noriaki Fujitani, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/381,114

(22) PCT Filed: Feb. 26, 2013

(86) PCT No.: PCT/JP2013/054917
§ 371 (c)(1),
(2) Date: Aug. 26, 2014

(87) PCT Pub. No.: WO2013/133088
PCT Pub. Date: Sep. 12, 2013

(65) Prior Publication Data
US 2015/0031206 A1  Jan. 29, 2015

(30) Foreign Application Priority Data
Mar. 8, 2012  (JP) ................................. 2012-052025

(51) Int. Cl.
| | |
|---|---|
| *G03F 7/11* | (2006.01) |
| *G03F 7/40* | (2006.01) |
| *G03F 7/09* | (2006.01) |
| *C08G 65/40* | (2006.01) |
| *C08G 63/685* | (2006.01) |
| *C08G 63/91* | (2006.01) |
| *H01L 21/308* | (2006.01) |
| *H01L 21/311* | (2006.01) |

(52) U.S. Cl.
CPC ............ *G03F 7/092* (2013.01); *C08G 63/6856* (2013.01); *C08G 63/91* (2013.01); *C08G 65/40* (2013.01); *G03F 7/094* (2013.01); *G03F 7/11* (2013.01); *H01L 21/3081* (2013.01); *H01L 21/3085* (2013.01); *H01L 21/3086* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 5,382,637 | A * | 1/1995 | Angelopoulos et al. | 525/436 |
| 2007/0105040 | A1 | 5/2007 | Toukhy et al. | |
| 2011/0033800 | A1 | 2/2011 | Zampini et al. | |
| 2014/0287589 | A1* | 9/2014 | Endo et al. | 438/694 |
| 2015/0087155 | A1* | 3/2015 | Endo et al. | 438/703 |

FOREIGN PATENT DOCUMENTS

| | | |
|---|---|---|
| ES | 2343291 B1 * | 7/2010 |
| JP | A-2009-516207 | 4/2009 |

(Continued)

OTHER PUBLICATIONS

Park et al "A functionalizable reverse thermal gel based on a polyurethane/PEG block copolymer", Biomaterials, vol. 32 (Year 2011) pp. 777-786, available on line Oct. 9, 2010, obtained from www.elsevier.com/locate/biomaterials.*

(Continued)

*Primary Examiner* — Cynthia Hamilton
(74) *Attorney, Agent, or Firm* — Oliff PLC

(57) ABSTRACT

A composition for forming a resist underlayer film for lithography, including a polymer having a repeating structural unit of Formula (1):

$R_1$ is a hydrogen atom or a methyl group and $Q_1$ is a group of Formula (2) or Formula (3):

(wherein $R_2$, $R_3$, $R_5$, and $R_6$ are independently a hydrogen atom or a linear or branched hydrocarbon group having a carbon atom number of 1 to 4, $R_4$ is a hydrogen atom or a methyl group, $R_7$ is a linear or branched hydrocarbon group having a carbon atom number of 1 to 6, a $C_{1-4}$ alkoxy group, a $C_{1-4}$ alkylthio group, a halogen atom, a cyano group, or a nitro group, $w_1$ is an integer of 0 to 3, $w_2$ is an integer of 0 to 2, and x is an integer of 0 to 3), and $v_1$ and $v_2$ are independently 0 or 1; and an organic solvent.

6 Claims, No Drawings

(56) References Cited

FOREIGN PATENT DOCUMENTS

| JP | A-2011-042645 | 3/2011 |
|---|---|---|
| WO | WO 03/017002 A1 | 2/2003 |
| WO | WO 2007/054813 A2 | 5/2007 |
| WO | WO 2011/004721 A1 | 1/2011 |

OTHER PUBLICATIONS

Park et al "Antiviral and Antibacterial Polyurethanes of Various Modalities", Appl Biochem Biotechnol (2013) 169: 1134-1146 published online Jan. 10, 2013.*

English abstract downloaded May 27, 2015 for ES 2343291 B1 one page from EPO website, one page.*

Wang et al "Synthesis of Novel branched polyethylene glycol" abstract (Accession No. 2007:506483, CAN 148:562292 from SciFinder database of an article from Hecheng Huazue, vol. 15, issue 2,pp. 216-218 publlished in 2007, only 2 page abstract here not acticle.*

International Search Report issued in PCT/JP2013/054917 mailed May 7, 2013.

International Preliminary Report on Patentability issued in PCT/JP2013/054917 issued Sep. 9, 2014.

* cited by examiner

COMPOSITION FOR FORMING HIGHLY ADHESIVE RESIST UNDERLAYER FILM

TECHNICAL FIELD

The present invention relates to a composition for forming a resist underlayer film which has improved adhesion to a resist, in a lithography process, and which is useful for forming a desired resist pattern on the resist underlayer film. The present invention also relates to a method for fabricating a semiconductor device including the composition.

BACKGROUND ART

In ArF immersion lithography and extreme ultraviolet (EUV) lithography, finer widths of resist lines have been desired. When fine resist patterns are formed, the area at which the resist patterns are in contact with a base substrate is small to make the aspect ratio (resist height/resist line width) high, which raises concerns for the tendency of the resist patterns to collapse. Because of this, a resist underlayer film (an anti-reflective coating) in contact with a resist is required to be highly adhesive to the resist so that resist patterns do not collapse.

Patent Document 1 describes that, in order to make a resist underlayer film highly adhesive to a resist, the use of a lactone structure as a constituent of a composition for forming a resist underlayer film enhances adhesion of the resultant resist underlayer film to resist patterns. In other words, the use of a structure having a polar moiety such as a lactone structure as a constituent of a composition for forming a resist underlayer film is expected to enhance adhesion to resist patterns and even prevent fine resist patterns from collapsing.

However, in the process of lithography such as ArF immersion lithography and extreme ultraviolet (EUV) lithography in which finer resist patterns are required to be formed, such use of a lactone structure as a constituent of a composition for forming a resist underlayer film is not enough for preventing resist patterns from collapsing.

PRIOR ART DOCUMENTS

Patent Document

Patent Document 1: International Publication No. WO 2003/017002

SUMMARY OF THE INVENTION

Problem to be Solved by the Invention

Approaches to achieve high adhesion to a resist include a method to control the chemical state of the interface between a resist and a resist underlayer film. This method works as follows: As for a positive resist, in the case where the chemical state of the interface between the resist and a resist underlayer film is acidic, the resultant resist patterns are formed in an undercut profile. Accordingly, the area at which the resist patterns are in contact with the resist underlayer film is extremely small, which tends to result in collapse of the resist patterns. On the other hand, by controlling the chemical state of the interface between the resist and a resist underlayer film to be basic, the resist patterns are not formed in an undercut profile. Therefore, adhesion of the resist underlayer film to the resist is expected to be even higher than one achieved by incorporation of a polar moiety such as a lactone structure.

An object of the present invention is to provide a composition for forming a resist underlayer film for rendering the surface state of the resultant resist underlayer film basic in order to enhance adhesion of the resist underlayer film to resist patterns formed on the resist underlayer film and also prevent the resist patterns from being formed in an undercut profile.

Means for Solving the Problem

A first aspect of the present invention provides a composition for forming a resist underlayer film for lithography, the composition comprising a polymer having, in a main chain, a repeating structural unit of Formula (1):

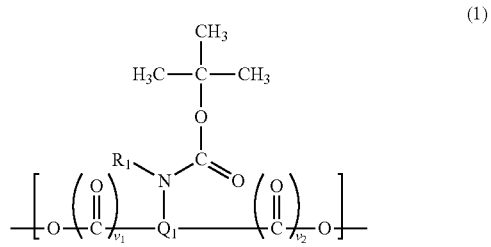

(where $R_1$ is a hydrogen atom or a methyl group, $Q_1$ is a group of Formula (2) or Formula (3):

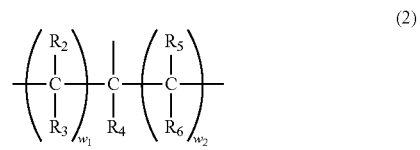

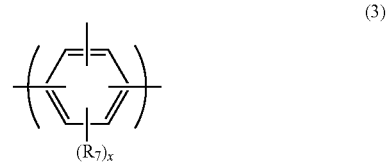

(where $R_2$, $R_3$, $R_5$, and $R_6$ are independently a hydrogen atom or a linear or branched hydrocarbon group having a carbon atom number of 1 to 4, $R_4$ is a hydrogen atom or a methyl group, $R_7$ is a linear or branched hydrocarbon group having a carbon atom number of 1 to 6, a $C_{1-4}$ alkoxy group, a $C_{1-4}$ alkylthio group, a halogen atom, a cyano group, or a nitro group, $w_1$ is an integer of 0 to 3, $w_2$ is an integer of 0 to 2, and x is an integer of 0 to 3), and $v_1$ and $v_2$ are independently 0 or 1); and an organic solvent.

The repeating structural unit of Formula (1) is represented by Formula (1') when $Q_1$ is a group of Formula (2), while the repeating structural unit of Formula (1) is represented by Formula (1") when $Q_1$ is a group of Formula (3):

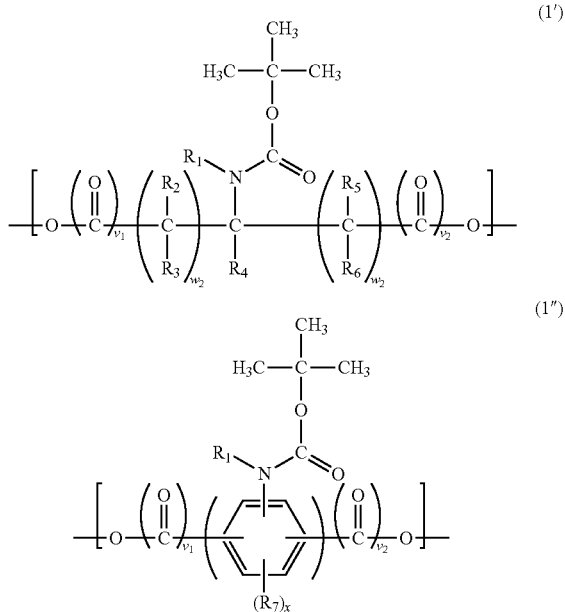

The polymer may further have, in a main chain, at least one (for example, one, two, or three) structural unit of Formula (4):

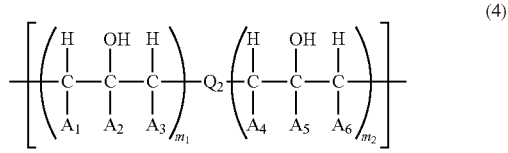

(where $A_1$, $A_2$, $A_3$, $A_4$, $A_5$, and $A_6$ are independently a hydrogen atom, a methyl group, or an ethyl group, $Q_2$ is a divalent organic group, and $m_1$ and $m_2$ are independently 0 or 1).

In Formula (4), $Q_2$ is a divalent organic group of Formula (5), for example:

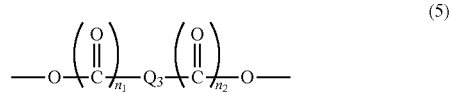

(where $Q_3$ is a divalent organic group that contains at least one of $C_{1-10}$ alkylene groups, $C_{2-6}$ alkenylene groups, $C_{3-10}$ alicyclic hydrocarbon rings, and $C_{6-14}$ aromatic hydrocarbon rings, the divalent organic group is optionally substituted with at least one selected from the group consisting of $C_{1-6}$ alkyl groups, a halogen atom, a hydroxy group, $C_{1-6}$ alkoxy groups, $C_{2-6}$ alkoxycarbonyl groups, a nitro group, a cyano group, and $C_{1-6}$ alkylthio groups, in the case where the divalent organic group contains two alkylene groups, two alicyclic hydrocarbon rings, or two aromatic hydrocarbon rings, the two alkylene groups, the two alicyclic hydrocarbon rings, or the two aromatic hydrocarbon rings are optionally bonded to each other through a linking group selected from the group consisting of a sulfonyl group, a disulfide group, a sulfide group, a carbonyl group, a —C(=O)O— group, a —O— group, a —C(CH$_3$)$_2$— group, and a —C(CF$_3$)$_2$— group, and $n_1$ and $n_2$ are independently 0 or 1).

In the present specification, examples of the alkyl groups include a methyl group, an ethyl group, and a propyl group and examples of the halogen atom include a fluorine atom, a chlorine atom, a bromine atom, and an iodine atom. Examples of the alkoxy groups include a methoxy group, an ethoxy group, a propoxy group, an isopropoxy group, a butoxy group, an isobutoxy group, a sec-butoxy group, and a tert-butoxy group. Examples of the alkylene groups include a methylene group, an ethylene group, a propylene group, and a butylene group. Examples of the alkenylene groups include a —CH=CH— group. Examples of the alicyclic hydrocarbon rings include a cyclopropane ring, a cyclobutane ring, a cyclopentane ring, and a cyclohexane ring. Examples of the aromatic hydrocarbon rings include a benzene ring, a naphthalene ring, and an anthracene ring. In the case where the divalent organic group contains two alkylene groups, two alicyclic hydrocarbon rings, or two aromatic hydrocarbon rings, the two alkylene groups, the two alicyclic hydrocarbon rings, or the two aromatic hydrocarbon rings are optionally bonded to each other through a linking group such as a sulfonyl group, a disulfide group, a sulfide group, a carbonyl group, a —C(=O)O— group, a —O— group, a —C(CH$_3$)$_2$— group, and a —C(CF$_3$)$_2$— group. Examples of the alkenyl groups to be described later include an allyl group.

In Formula (4), $Q_2$ is alternatively a divalent organic group of Formula (6):

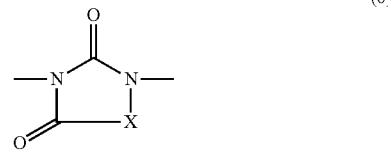

(where X is a divalent group of Formula (7) or Formula (8));

(where $R_8$ and $R_9$ are independently a hydrogen atom, a $C_{1-6}$ alkyl group, a $C_{3-6}$ alkenyl group, a benzyl group, or a phenyl group, the phenyl group is optionally substituted with at least one selected from the group consisting of $C_{1-6}$ alkyl groups, a halogen atom, $C_{1-6}$ alkoxy groups, a nitro group, a cyano group, and $C_{1-6}$ alkylthio groups, and $R_8$ and $R_9$ are optionally bonded to each other to form, together with the carbon atom to which $R_8$ and $R_9$ are bonded, a $C_{3-6}$ ring).

In Formula (4), $Q_2$ is alternatively a divalent organic group of Formula (9):

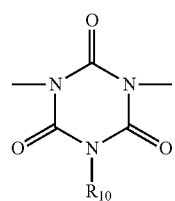
(9)

(where R₁₀ is a $C_{1-6}$ alkyl group, a $C_{3-6}$ alkenyl group, a benzyl group, or a phenyl group, and the phenyl group is optionally substituted with at least one selected from the group consisting of $C_{1-6}$ alkyl groups, a halogen atom, $C_{1-6}$ alkoxy groups, a nitro group, a cyano group, and $C_{1-6}$ alkylthio groups).

The composition for forming a resist underlayer film according to the first aspect of the present invention may further comprise a crosslinking agent and a crosslinking catalyst.

A second aspect of the present invention provides a method for fabricating a semiconductor device, the method comprising: coating a substrate having a subject film with the composition for forming a resist underlayer film according to the first aspect of the present invention, baking the composition to form a resist underlayer film, coating the resist underlayer film with a resist, applying radiation selected from the group consisting of a KrF excimer laser, an ArF excimer laser, extreme ultraviolet light, and an electron beam to the resist-coated substrate, performing development to form a resist pattern, and patterning the subject film by dry etching using the resist pattern as a mask.

Effects of the Invention

The composition for forming a resist underlayer film of the present invention when used in a lithography process effectively prevents collapse of resist patterns with fine line widths which are formed on a resist underlayer film formed of the composition.

MODES FOR CARRYING OUT THE INVENTION

The composition for forming a resist underlayer film of the present invention for lithography includes a polymer having, in the main chain, a repeating structural unit of Formula (1) that contains an amino group protected by a tert-butoxycarbonyl group (hereinafter, abbreviated as a Boc group). The weight average molecular weight of the polymer is 1,000 to 50,000, for example. In the case where $Q_1$ in Formula (1) is represented by Formula (2), the amino group protected by a Boc group is bonded to the carbon atom to which $R_4$ representing a hydrogen atom or a methyl group is bonded, while in the case where $Q_1$ in Formula (1) is represented by Formula (3), the amino group protected by a Boc group is bonded to the phenylene group.

Examples of monomers as raw materials of the polymer having the repeating structural unit of Formula (1) in the main chain include compounds of Formula (10-a) to Formula (10-h) that contain an amino group protected by a Boc group:

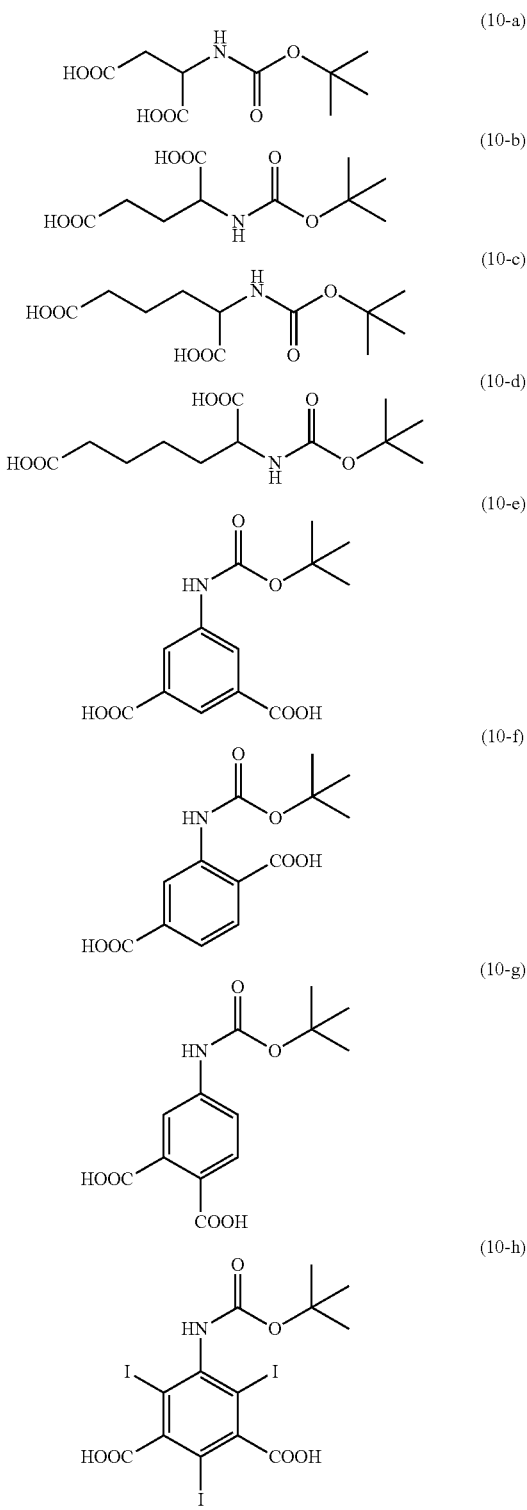

A polymer having the structural unit of Formula (1) and the structural unit of Formula (4) is obtained, for example, by a reaction of a compound containing a terminal epoxy group and a monomer having a substituent such as a carboxy group that reacts with the epoxy group. As such a monomer, compounds of Formula (10-a) to Formula (10-h), in other words, N-(tert-butoxycarbonyl)aspartic acid, N-(tert-butoxycarbonyl)glutamic acid, 2-N-(tert-butoxycarbonyl)aminoadipic acid, 2-N-(tert-butoxycarbonyl)aminopimelic acid, 5-N-(tert-butoxycarbonyl)aminoisophthalic acid, 6-N-(tert-butoxycarbonyl)aminoterephthalic acid, 4-N-(tert-butoxycarbonyl)aminophthalic acid, and 5-N-(tert-butoxycarbonyl)amino-2,4,6-triiodoisophthalic acid can be exemplified. Preferable among these compounds is N-(tert-butoxycarbonyl)aspartic acid of Formula (10-a).

Non-limitative examples of the compound containing an epoxy group include compounds of Formula (11-a) to Formula (11-k) containing two epoxy groups:

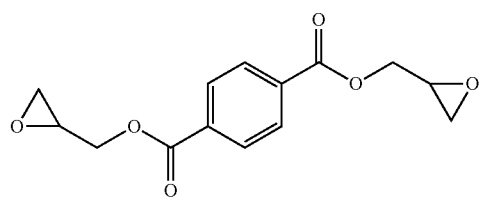
(11-a)

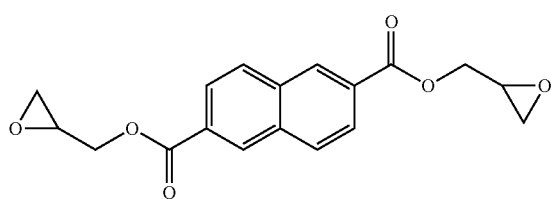
(11-b)

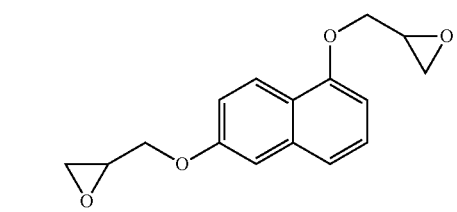
(11-c)

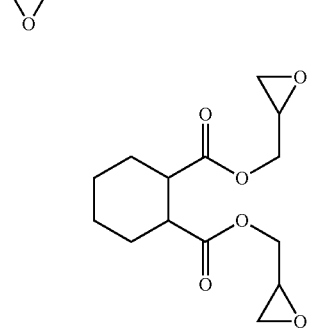
(11-d)

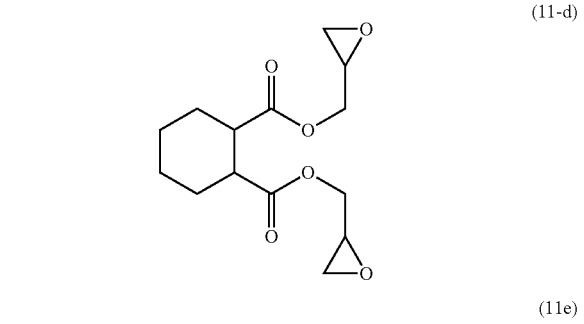
(11-e)

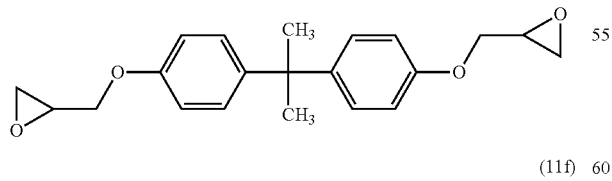
(11-f)

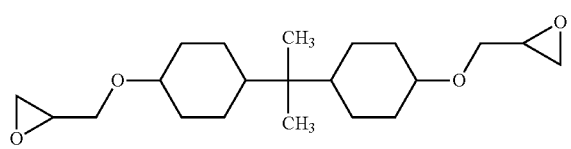
(11-g)

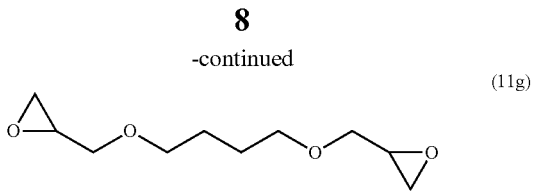
(11-h)

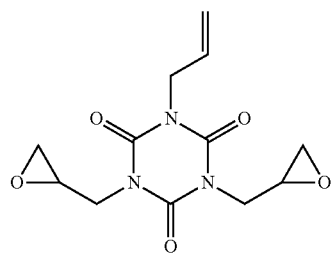
(11-i)

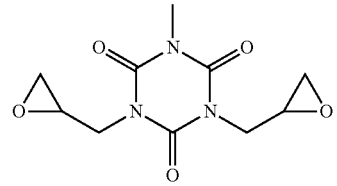
(11-j)

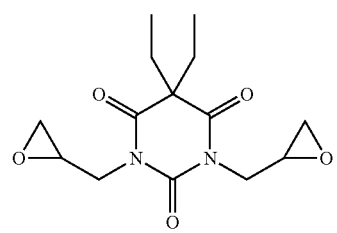
(11-k)

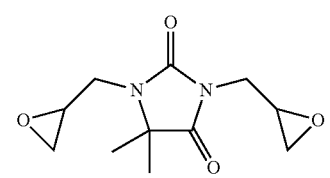

namely, 1,4-terephthalic acid diglycidyl, 2,6-naphthalene dicarboxylic acid diglycidyl, 1,6-dihydroxynaphthalene diglycidyl, 1,2-cyclohexane dicarboxylic acid diglycidyl, 2,2-bis(4-hydroxyphenyl)propane diglycidyl, 2,2-bis(4-hydroxycyclohexane)propane diglycidyl, 1,4-butanediol diglycidyl, monoallyl isocyanuric acid diglycidyl, monomethyl isocyanuric acid diglycidyl, 5,5-diethyl barbituric acid diglycidyl, and 5,5-dimethyl hydantoin diglycidyl.

The polymer having the structural unit of Formula (1) and the structural unit of Formula (4) is also obtained by using the compound containing an epoxy group and an additional compound that reacts with such a compound containing an epoxy group. Non-limitative examples of the additional compound include compounds of Formula (12-a) to Formula (12-s) containing two carboxy groups, two hydroxyphenyl groups, or two imido groups, and acid dianhydrides:

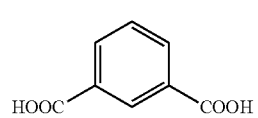
(12-a)

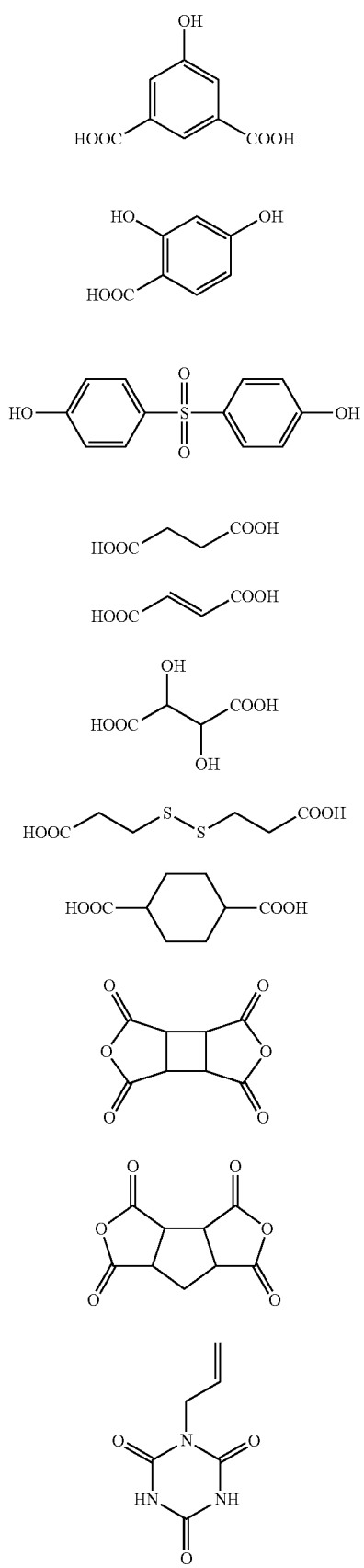
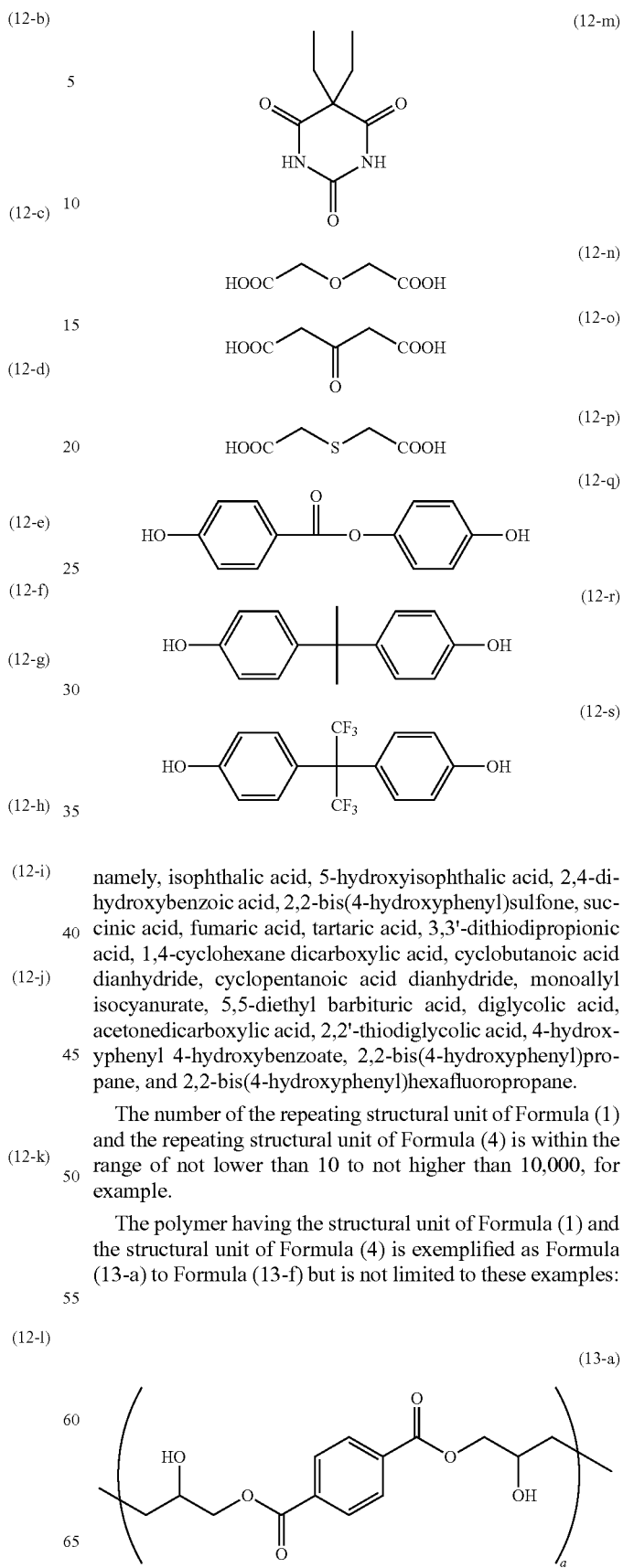

namely, isophthalic acid, 5-hydroxyisophthalic acid, 2,4-dihydroxybenzoic acid, 2,2-bis(4-hydroxyphenyl)sulfone, succinic acid, fumaric acid, tartaric acid, 3,3'-dithiodipropionic acid, 1,4-cyclohexane dicarboxylic acid, cyclobutanoic acid dianhydride, cyclopentanoic acid dianhydride, monoallyl isocyanurate, 5,5-diethyl barbituric acid, diglycolic acid, acetonedicarboxylic acid, 2,2'-thiodiglycolic acid, 4-hydroxyphenyl 4-hydroxybenzoate, 2,2-bis(4-hydroxyphenyl)propane, and 2,2-bis(4-hydroxyphenyl)hexafluoropropane.

The number of the repeating structural unit of Formula (1) and the repeating structural unit of Formula (4) is within the range of not lower than 10 to not higher than 10,000, for example.

The polymer having the structural unit of Formula (1) and the structural unit of Formula (4) is exemplified as Formula (13-a) to Formula (13-f) but is not limited to these examples:

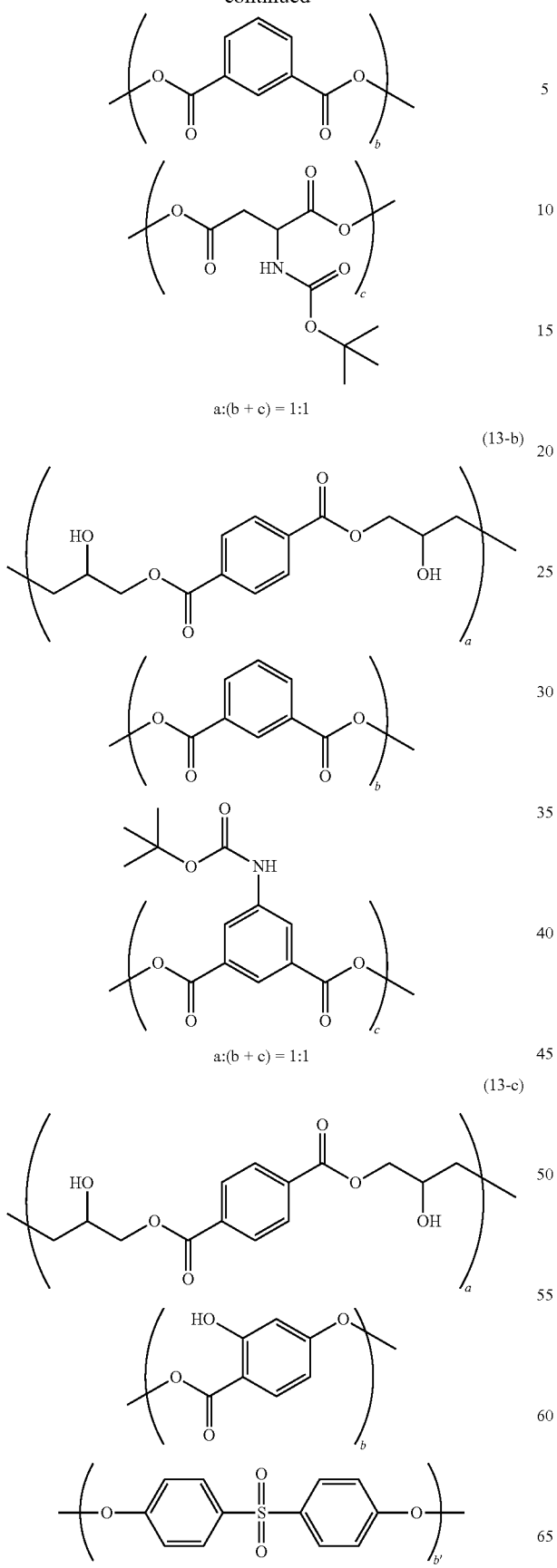
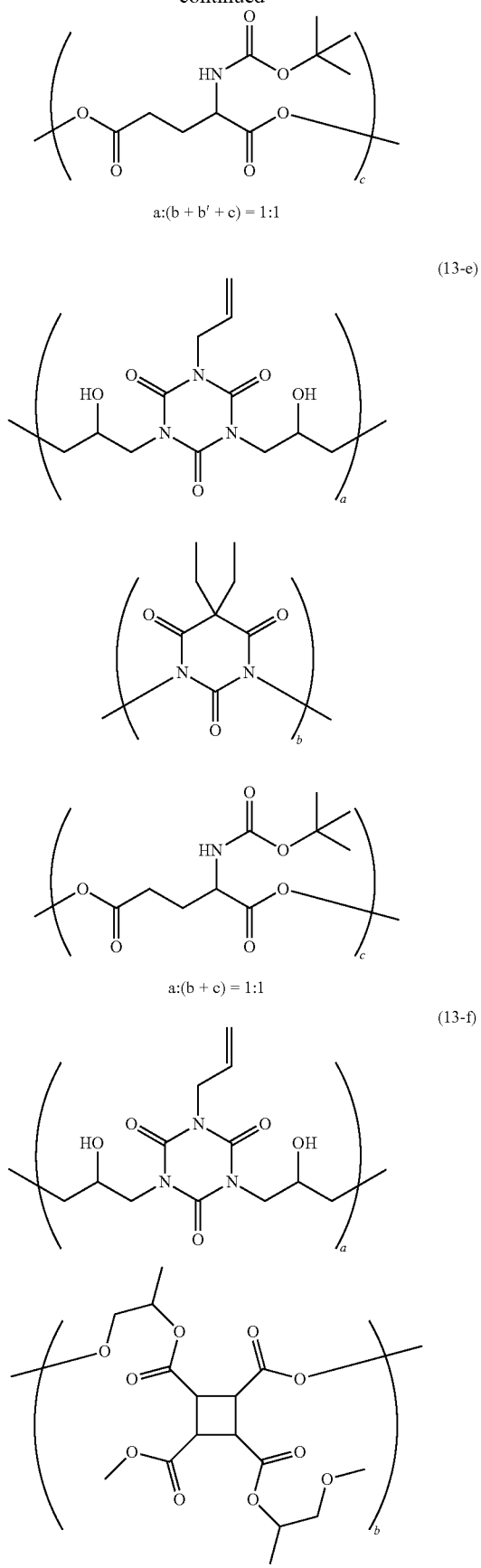

-continued

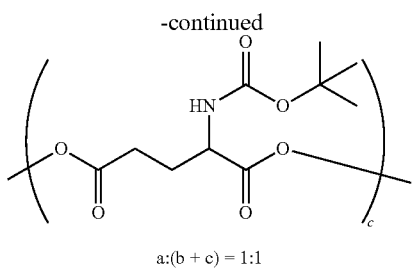

a:(b + c) = 1:1

A polymer having a structural unit of the Formula (13-a) is obtained by polymerization using a compound of Formula (10-a), a compound of Formula (11-a), and a compound of Formula (12-a) as raw materials. A polymer having a repeating structural unit of Formula (13-d) is obtained by polymerization using a compound of Formula (10-b), a compound of Formula (11-a), and compounds of Formula (12-c) and Formula (12-d) as raw materials.

The molar ratio of structural unit a, structural unit b, and structural unit c in Formula (13-a), Formula (13-b), Formula (13-c), Formula (13-e), and Formula (13-f) satisfies a:(b+c)=1:1. The molar ratio of structural unit a, structural unit b, structural unit b', and structural unit c in Formula (13-d) satisfies a:(b+b'+c)=1:1.

As for the molar ratio a:(b+c)=1:1 for Formula (13-a), Formula (13-b), Formula (13-c), Formula (13-e), and Formula (13-f), the molar ratio between b and c can be expressed as b:c=(1−x):x. As for the molar ratio a:(b+b'+c)=1:1 for Formula (13-d), the molar ratio between b+b' and c can be expressed as (b+b'):c=(1−x):x. In these molar ratios, x is 0.01 to 1 and is preferably 0.03 to 0.5.

Examples of an organic solvent contained in the composition for forming a resist underlayer film of the present invention include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more selected from these organic solvents. The proportion of the organic solvent in the composition for forming a resist underlayer film of the present invention is not lower than 50% by mass and not higher than 99.9% by mass, for example.

The proportion of the polymer that is contained in the composition for forming a resist underlayer film of the present invention is, for example, 0.1% by mass to 50% by mass of the composition for forming a resist underlayer film.

The composition for forming a resist underlayer film of the present invention may include a crosslinking agent and a crosslinking catalyst that is a compound to promote a crosslinking reaction, in addition to the polymer and the organic solvent. With the component that remains after removal of the organic solvent from the composition for forming a resist underlayer film of the present invention being defined as solid matter, the solid matter includes the polymer and additives such as a crosslinking agent and a crosslinking catalyst added where appropriate. The proportion of the additives is, for example, 0.1% by mass to 50% by mass and is preferably 1% by mass to 30% by mass relative to the solid matter in the composition for forming a resist underlayer film of the present invention.

Examples of the crosslinking agent contained as an optional component in the composition for forming a resist underlayer film of the present invention include hexamethoxymethylmelamine, tetramethoxymethylbenzoguanamine, 1,3,4,6-tetrakis(methoxymethyl)glycoluril (POWDERLINK [registered trademark] 1174), 1,3,4,6-tetrakis(butoxymethyl)glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl) urea. The proportion of the crosslinking agent, when used, is 1% by mass to 50% by mass, for example, and is preferably 5% by mass to 30% by mass in the polymer.

Examples of the crosslinking catalyst contained as an optional component in the composition for forming a resist underlayer film of the present invention include sulfonic acid compounds and carboxylic acid compounds such as p-toluenesulfonic acid, trifluoromethanesulfonic acid, pyridinium p-toluenesulfonate, salicylic acid, camphor sulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. The proportion of the crosslinking catalyst, when used, is 0.1% by mass to 50% by mass, for example, and is preferably 1% by mass to 30% by mass relative to the crosslinking agent.

As a substrate to be used in the method for fabricating a semiconductor device according to the second aspect of the present invention, a silicon wafer is typically used and an SOI (Silicon on Insulator) substrate or a compound semiconductor wafer composed of gallium arsenide (GaAs), indium phosphide (InP), gallium phosphide (GaP), or the like may alternatively be used. On the substrate, an insulating film such as a silicon oxide film, a nitrogen-containing silicon oxide film (a SiON film), a carbon-containing silicon oxide film (a SiOC film), and a fluorine-containing silicon oxide film (a SiOF film) is formed as a subject film. In this case, a resist underlayer film is formed on the subject film.

In the method for fabricating a semiconductor device of the present invention, a resist solution used to coat the resist underlayer film with a resist may be either a positive one or a negative one and can be a chemically amplified resist that is photosensitive to radiation selected from the group consisting of a KrF excimer laser, an ArF excimer laser, extreme ultraviolet light, and an electron beam. A developer solution used in development after such irradiation can be an alkaline developer solution such as a tetramethylammonium hydroxide (TMAH) aqueous solution, for example.

The present invention will be described specifically by synthesis examples and examples. The scope of the present invention is, however, not limited to these synthesis examples and examples.

The weight average molecular weights of the polymers in Synthesis Example 1 to Synthesis Example 17 below in the present specification were measured by gel permeation chromatography (hereinafter, abbreviated as GPC). The measurement was performed on a GPC device manufactured by Tosoh Corporation, and the measurement conditions and the like are as follows:

GPC column: Shodex [registered trademark] and Asahipak [registered trademark]
(Showa Denko K.K.)
Column temperature: 40° C.
Solvent: N,N-dimethylformamide (DMF)
Flow rate: 0.6 ml/minute
Standard sample: polystyrene (Tosoh Corporation)

EXAMPLES

Synthesis Example 1

14.00 g of 1,4-terephthalic acid diglycidyl (trade name: EX-711 [registered trademark], Nagase ChemteX Corporation), 8.08 g of isophthalic acid, 0.90 g of ethyltriphenylphosphonium bromide, and 91.94 g of propylene glycol monomethyl ether were mixed, and the resultant mixture was heated and refluxed with stirring for 4 hours. To the resultant polymer solution, 23 g of a cation exchange resin (trade name: DOWEX [registered trademark] 550A, Muromachi Technos Co., Ltd) and 23 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 17,800 in terms of standard polystyrene.

Synthesis Example 2

5.00 g of 1,4-terephthalic acid diglycidyl (trade name: EX-711 [registered trademark], Nagase ChemteX Corporation), 2.60 g of isophthalic acid, 0.41 g of N-(tert-butoxycarbonyl)-L-aspartic acid, 0.32 g of ethyltriphenylphosphonium bromide, and 33.30 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 13,600 in terms of standard polystyrene.

Synthesis Example 3

5.00 g of 1,4-terephthalic acid diglycidyl (trade name: EX-711 [registered trademark], Nagase ChemteX Corporation), 2.02 g of isophthalic acid, 1.22 g of N-(tert-butoxycarbonyl)-L-aspartic acid, 0.32 g of ethyltriphenylphosphonium bromide, and 34.23 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 8,000 in terms of standard polystyrene.

Synthesis Example 4

5.00 g of 1,4-terephthalic acid diglycidyl (trade name: EX-711 [registered trademark], Nagase ChemteX Corporation), 2.60 g of isophthalic acid, 0.43 g of N-(tert-butoxycarbonyl)-L-glutamic acid, 0.32 g of ethyltriphenylphosphonium bromide, and 33.40 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 16,400 in terms of standard polystyrene.

Synthesis Example 5

5.00 g of 1,4-terephthalic acid diglycidyl (trade name: EX-711 [registered trademark], Nagase ChemteX Corporation), 2.02 g of isophthalic acid, 1.29 g of N-(tert-butoxycarbonyl)-L-glutamic acid, 0.32 g of ethyltriphenylphosphonium bromide, and 34.53 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 13,900 in terms of standard polystyrene.

Synthesis Example 6

To 5.00 g of 5-aminoisophthalic acid, 80 mL of 1,4-dioxane and 80 mL of an aqueous solution in which 2.21 g of sodium hydroxide was dissolved were added and, to the resultant, 9.04 g of di(tert-butyl)dicarbonate was added, followed by stirring at room temperature for 19 hours. To the resultant reaction mixture, a saturated aqueous citric acid solution was added to make the reaction mixture acidic, followed by filtration of the precipitated solid. The filtration product was dried under reduced pressure to obtain 7.01 g of 5-(tert-butoxycarbonyl)aminoisophthalic acid at a yield of 90%.

Synthesis Example 7

5.00 g of 1,4-terephthalic acid diglycidyl (trade name: EX-711 [registered trademark], Nagase ChemteX Corporation), 2.60 g of isophthalic acid, 0.49 g of 5-(tert-butoxycarbonyl)aminoisophthalic acid resulting from Synthesis Example 6, 0.32 g of ethyltriphenylphosphonium bromide, and 33.63 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 18,000 in terms of standard polystyrene.

Synthesis Example 8

5.00 g of 1,4-terephthalic acid diglycidyl (trade name: EX-711 [registered trademark], Nagase ChemteX Corporation), 2.02 g of isophthalic acid, 1.47 g of 5-(tert-butoxycarbonyl)aminoisophthalic acid, 0.32 g of ethyltriphenylphosphonium bromide, and 35.23 g of propylene glycol monomethyl ether were mixed, and the resultant mixture was heated and refluxed with stirring for 4 hours. To the resultant polymer solution, 8 g of a cation exchange resin (trade name: DOWEX [registered trademark] 550A, Muromachi Technos Co., Ltd) and 8 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 17,900 in terms of standard polystyrene.

Synthesis Example 9

12.00 g of 1,4-terephthalic acid diglycidyl (trade name: EX-711 [registered trademark], Nagase ChemteX Corporation), 3.21 g of 2,4-dihydroxybenzoic acid, 5.22 g of bis(4-hydroxyphenyl)sulfone, 0.77 g of ethyltriphenylphosphonium bromide, and 84.82 g of propylene glycol monomethyl ether were mixed, and the resultant mixture was heated and refluxed with stirring for 4 hours. To the resultant polymer solution, 22 g of a cation exchange resin (trade name: DOWEX [registered trademark] 550A, Muromachi Technos Co., Ltd) and 22 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 5,500 in terms of standard polystyrene.

Synthesis Example 10

6.00 g of 1,4-terephthalic acid diglycidyl (trade name: EX-711 [registered trademark], Nagase ChemteX Corporation), 1.45 g of 2,4-dihydroxybenzoic acid, 2.35 g of bis(4-hydroxyphenyl)sulfone, 0.52 g of N-(tert-butoxycarbonyl)-L-glutamic acid, 0.39 g of ethyltriphenylphosphonium bromide, and 42.78 g of propylene glycol monomethyl ether were mixed, and the resultant mixture was heated and refluxed with stirring for 4 hours. To the resultant polymer solution, 11 g of a cation exchange resin (trade name: DOWEX [registered trademark] 550A, Muromachi Technos Co., Ltd) and 11 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 4,500 in terms of standard polystyrene.

Synthesis Example 11

6.00 g of 1,4-terephthalic acid diglycidyl (trade name: EX-711 [registered trademark], Nagase ChemteX Corporation), 1.12 g of 2,4-dihydroxybenzoic acid, 1.83 g of bis(4-hydroxyphenyl)sulfone, 1.55 g of N-(tert-butoxycarbonyl)-L-glutamic acid, 0.39 g of ethyltriphenylphosphonium bromide, and 43.54 g of propylene glycol monomethyl ether were mixed, and the resultant mixture was heated and refluxed with stirring for 4 hours. To the resultant polymer solution, 11 g of a cation exchange resin (trade name: DOWEX [registered trademark] 550A, Muromachi Technos Co., Ltd) and 11 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 3,200 in terms of standard polystyrene.

Synthesis Example 12

13.00 g of monoallyl diglycidyl isocyanurate (trade name: MA-DGIC [registered trademark], Shikoku Chemicals Corporation), 8.65 g of 5,5-diethyl barbituric acid, 0.53 g of benzyltriethylammonium chloride, and 88.72 g of propylene glycol monomethyl ether were mixed, and the resultant mixture was heated and refluxed with stirring for 4 hours. To the resultant polymer solution, 22 g of a cation exchange resin (trade name: DOWEX [registered trademark] 550A, Muromachi Technos Co., Ltd) and 22 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 8,000 in terms of standard polystyrene.

Synthesis Example 13

7.00 g of monoallyl diglycidyl isocyanurate (trade name: MA-DGIC [registered trademark], Shikoku Chemicals Corporation), 4.19 g of 5,5-diethyl barbituric acid, 0.59 g of N-(tert-butoxycarbonyl)-L-aspartic acid, 0.47 g of ethyltriphenylphosphonium bromide, and 48.99 g of propylene glycol monomethyl ether were mixed, and the resultant mixture was heated and refluxed with stirring for 4 hours. To the resultant polymer solution, 12 g of a cation exchange resin (trade name: DOWEX [registered trademark] 550A, Muromachi Technos Co., Ltd) and 12 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 7,600 in terms of standard polystyrene.

Synthesis Example 14

7.00 g of monoallyl diglycidyl isocyanurate (trade name: MA-DGIC [registered trademark], Shikoku Chemicals Corporation), 3.26 g of 5,5-diethyl barbituric acid, 1.77 g of N-(tert-butoxycarbonyl)-L-aspartic acid, 0.47 g of ethyltriphenylphosphonium bromide, and 49.98 g of propylene glycol monomethyl ether were mixed, and the resultant mixture was heated and refluxed with stirring for 4 hours. To the resultant polymer solution, 12 g of a cation exchange resin (trade name: DOWEX [registered trademark] 550A, Muromachi Technos Co., Ltd) and 12 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 4,200 in terms of standard polystyrene.

Synthesis Example 15

6.00 g of monoallyl diglycidyl isocyanurate (trade name: MA-DGIC [registered trademark], Shikoku Chemicals Corporation), 4.25 g of 1,2,3,4-cyclobutanetetracarboxylic dianhydride, 0.25 g of benzyltriethylammonium chloride, and 41.98 g of propylene glycol monomethyl ether were mixed, and the resultant mixture was heated and refluxed with stirring for 4 hours. To the resultant polymer solution, 10 g of a cation exchange resin (trade name: DOWEX [registered trademark] 550A, Muromachi Technos Co., Ltd) and 10 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 10,000 in terms of standard polystyrene.

Synthesis Example 16

6.00 g of monoallyl diglycidyl isocyanurate (trade name: MA-DGIC [registered trademark], Shikoku Chemicals Corporation), 3.82 g of 1,2,3,4-cyclobutanetetracarboxylic dianhydride, 0.54 g of N-(tert-butoxycarbonyl)-L-glutamic acid, 0.40 g of ethyltriphenylphosphonium bromide, and 43.04 g of propylene glycol monomethyl ether were mixed, and the resultant mixture was heated and refluxed with stirring for 4 hours. To the resultant polymer solution, 11 g of a cation exchange resin (trade name: DOWEX [registered trademark] 550A, Muromachi Technos Co., Ltd) and 11 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 18,900 in terms of standard polystyrene.

Synthesis Example 17

6.00 g of monoallyl diglycidyl isocyanurate (trade name: MA-DGIC [registered trademark], Shikoku Chemicals Corporation), 2.97 g of 1,2,3,4-cyclobutanetetracarboxylic dianhydride, 1.61 g of N-(tert-butoxycarbonyl)-L-glutamic acid, 0.40 g of ethyltriphenylphosphonium bromide, and 43.93 g of propylene glycol monomethyl ether were mixed, and the resultant mixture was heated and refluxed with stirring for 4 hours. To the resultant polymer solution, 11 g of a cation exchange resin (trade name: DOWEX [registered trademark] 550A, Muromachi Technos Co., Ltd) and 11 g of an anion exchange resin (trade name: Amberlite [registered trademark] 15JWET, Organo Corporation) were added, and the resultant mixture was subjected to ion-exchange treatment at room temperature for 4 hours. GPC analysis showed that the resultant polymer solution had a weight average molecular weight of 13,200 in terms of standard polystyrene.

Example 1

2.50 g of the polymer solution resulting from Synthesis Example 2, 0.10 g of tetramethoxymethyl glycoluril (trade name: POWDERLINK [registered trademark] 1174, manufactured by Nihon Cytec Industries Inc.), 0.01 g of 5-sulfosalicylic acid, 44.20 g of propylene glycol monomethyl ether, and 5.14 g of propylene glycol monoethyl ether were mixed to prepare a composition for forming a resist underlayer film.

Example 2

2.50 g of the polymer solution resulting from Synthesis Example 3, 0.10 g of tetramethoxymethyl glycoluril (trade name: POWDERLINK [registered trademark] 1174, manufactured by Nihon Cytec Industries Inc.), 0.01 g of 5-sulfosalicylic acid, 40.39 g of propylene glycol monomethyl ether, and 4.72 g of propylene glycol monoethyl ether were mixed to prepare a composition for forming a resist underlayer film.

Example 3

2.50 g of the polymer solution resulting from Synthesis Example 4, 0.10 g of tetramethoxymethyl glycoluril (trade name: POWDERLINK [registered trademark] 1174, manufactured by Nihon Cytec Industries Inc.), 0.01 g of 5-sulfosalicylic acid, 44.34 g of propylene glycol monomethyl ether, and 5.16 g of propylene glycol monoethyl ether were mixed to prepare a composition for forming a resist underlayer film.

Example 4

2.50 g of the polymer solution resulting from Synthesis Example 5, 0.10 g of tetramethoxymethyl glycoluril (trade name: POWDERLINK [registered trademark] 1174, manufactured by Nihon Cytec Industries Inc.), 0.01 g of 5-sulfosalicylic acid, 42.77 g of propylene glycol monomethyl ether, and 4.99 g of propylene glycol monoethyl ether were mixed to prepare a composition for forming a resist underlayer film.

Example 5

2.50 g of the polymer solution resulting from Synthesis Example 7, 0.10 g of tetramethoxymethyl glycoluril (trade name: POWDERLINK [registered trademark] 1174, manufactured by Nihon Cytec Industries Inc.), 0.01 g of 5-sulfosalicylic acid, 44.54 g of propylene glycol monomethyl ether, and 5.18 g of propylene glycol monoethyl ether were mixed to prepare a composition for forming a resist underlayer film.

Example 6

2.50 g of the polymer solution resulting from Synthesis Example 8, 0.10 g of tetramethoxymethyl glycoluril (trade name: POWDERLINK [registered trademark] 1174, manufactured by Nihon Cytec Industries Inc.), 0.01 g of 5-sulfosalicylic acid, 43.40 g of propylene glycol monomethyl ether, and 5.06 g of propylene glycol monoethyl ether were mixed to prepare a composition for forming a resist underlayer film.

Example 7

2.50 g of the polymer solution resulting from Synthesis Example 10, 0.11 g of tetramethoxymethyl glycoluril (trade name: POWDERLINK [registered trademark] 1174, manufactured by Nihon Cytec Industries Inc.), 0.01 g of 5-sulfosalicylic acid, 36.44 g of propylene glycol monomethyl ether, and 16.50 g of propylene glycol monomethyl ether acetate were mixed to prepare a composition for forming a resist underlayer film.

Example 8

2.50 g of the polymer solution resulting from Synthesis Example 11, 0.10 g of tetramethoxymethyl glycoluril (trade name: POWDERLINK [registered trademark] 1174, manufactured by Nihon Cytec Industries Inc.), 0.01 g of 5-sulfosalicylic acid, 34.40 g of propylene glycol monomethyl ether, and 15.64 g of propylene glycol monomethyl ether acetate were mixed to prepare a composition for forming a resist underlayer film.

Example 9

2.50 g of the polymer solution resulting from Synthesis Example 13, 0.11 g of tetramethoxymethyl glycoluril (trade name: POWDERLINK [registered trademark] 1174, manufactured by Nihon Cytec Industries Inc.), 0.01 g of 5-sulfosalicylic acid, 35.50 g of propylene glycol monomethyl ether, and 16.10 g of propylene glycol monomethyl ether acetate were mixed to prepare a composition for forming a resist underlayer film.

Example 10

2.50 g of the polymer solution resulting from Synthesis Example 14, 0.11 g of tetramethoxymethyl glycoluril (trade name: POWDERLINK [registered trademark] 1174, manufactured by Nihon Cytec Industries Inc.), 0.01 g of 5-sulfosalicylic acid, 35.05 g of propylene glycol monomethyl ether, and 15.91 g of propylene glycol monomethyl ether acetate were mixed to prepare a composition for forming a resist underlayer film.

Example 11

2.00 g of the polymer solution resulting from Synthesis Example 16, 0.11 g of tetramethoxymethyl glycoluril (trade name: POWDERLINK [registered trademark] 1174, manufactured by Nihon Cytec Industries Inc.), 0.01 g of 5-sulfosalicylic acid, 37.73 g of propylene glycol monomethyl ether, and 16.84 g of propylene glycol monomethyl ether acetate were mixed to prepare a composition for forming a resist underlayer film.

Example 12

2.00 g of the polymer solution resulting from Synthesis Example 17, 0.10 g of tetramethoxymethyl glycoluril (trade name: POWDERLINK [registered trademark] 1174, manufactured by Nihon Cytec Industries Inc.), 0.01 g of 5-sulfosalicylic acid, 34.62 g of propylene glycol monomethyl ether, and 15.52 g of propylene glycol monomethyl ether acetate were mixed to prepare a composition for forming a resist underlayer film.

Comparative Example 1

2.50 g of the polymer solution resulting from Synthesis Example 1, 0.11 g of tetramethoxymethyl glycoluril (trade name: POWDERLINK [registered trademark] 1174, manufactured by Nihon Cytec Industries Inc.), 0.01 g of 5-sulfosalicylic acid, 46.21 g of propylene glycol monomethyl ether, and 5.36 g of propylene glycol monoethyl ether were mixed to prepare a composition for forming a resist underlayer film.

Comparative Example 2

2.00 g of the polymer solution resulting from Synthesis Example 9, 0.10 g of tetramethoxymethyl glycoluril (trade name: POWDERLINK [registered trademark] 1174, manufactured by Nihon Cytec Industries Inc.), 0.01 g of 5-sulfosalicylic acid, 32.72 g of propylene glycol monomethyl ether, and 14.72 g of propylene glycol monomethyl ether acetate were mixed to prepare a composition for forming a resist underlayer film.

Comparative Example 3

2.50 g of the polymer solution resulting from Synthesis Example 12, 0.11 g of tetramethoxymethyl glycoluril (trade name: POWDERLINK [registered trademark] 1174, manufactured by Nihon Cytec Industries Inc.), 0.01 g of 5-sulfosalicylic acid, 35.70 g of propylene glycol monomethyl ether, and 16.19 g of propylene glycol monomethyl ether acetate were mixed to prepare a composition for forming a resist underlayer film.

Comparative Example 4

2.00 g of the polymer solution resulting from Synthesis Example 15, 0.12 g of tetramethoxymethyl glycoluril (trade name: POWDERLINK [registered trademark] 1174, manufactured by Nihon Cytec Industries Inc.), 0.01 g of 5-sulfosalicylic acid, 40.34 g of propylene glycol monomethyl ether, and 17.94 g of propylene glycol monomethyl ether acetate were mixed to prepare a composition for forming a resist underlayer film.

(Resist Pattern Formation and Evaluation)

A silicon wafer having a nitrogen-containing silicon oxide film (SiON) (film thickness: 31.5 nm) deposited thereon by evaporation was subjected to spin coating with each of the compositions for forming a resist underlayer film prepared in Example 1 to Example 12 and Comparative Example 1 to Comparative Example 4 in the present specification to achieve a film thickness of 10 nm, and heating was performed at 205° C. for 60 seconds to form a resist underlayer film. The resultant resist underlayer film was subjected to spin coating with a positive resist solution for use with an ArF excimer laser (manufactured by JSR Corporation, trade name: AR2772JN), and was heated at 110° C. for 90 seconds, followed by exposure with an exposure device with an ArF excimer laser (NSR-S307E manufactured by NIKON CORPORATION) under predetermined conditions. After the exposure, heating (PEB) was performed at 110° C. for 90 seconds, and the resultant workpiece was cooled on a cooling plate to room temperature, followed by development and rinsing to form a resist pattern.

The target line width was set as an 80-nm line and space pattern (line: 80 nm, space: 100 nm), and the relation between a change in the exposure dose at the time of optimum focus and collapse of resist patterns was studied by critical dimension SEM metrology to determine the maximum exposure dose (the limit exposure dose) at which the resist patterns did not collapse and the dimensions of the resist patterns at that time (critical dimensions for pattern collapse). This made it possible to determine whether the composition for forming a resist underlayer film according to the present invention was capable of forming fine resist patterns while preventing the resist patterns from collapsing at high exposure doses. The cross-sectional profile of the resist patterns having an 80-nm line and space pattern as the target line width was also identified by cross-sectional SEM analysis. Accordingly, the shape of the resist patterns to cause collapse thereof can be determined with the composition for forming a resist underlayer film according to the present invention.

The results of the limit exposure dose, the critical dimensions for pattern collapse, and the cross-sectional profile of the resultant resist patterns are shown in Table 1 to Table 4. It is assumed that, when the limit exposure dose is higher and the critical dimensions for pattern collapse are smaller, resist patterns are less prone to collapse and a resist underlayer film is highly adhesive to a resist.

TABLE 1

| Composition for forming resist underlayer film | Limit exposure dose | Critical dimensions for pattern collapse | Cross-sectional profile of patterns |
|---|---|---|---|
| Example 1 | 33.5 mJ/cm$^2$ | 46.89 nm | Straight |
| Example 2 | 36.5 mJ/cm$^2$ | 47.26 nm | Tapered |
| Example 3 | 32 mJ/cm$^2$ | 48.75 nm | Straight |
| Example 4 | 33.5 mJ/cm$^2$ | 48.82 nm | Tapered |
| Example 5 | 30.5 mJ/cm$^2$ | 51.18 nm | Straight |
| Example 6 | 35 mJ/cm$^2$ | 45.36 nm | Tapered |
| Comparative Example 1 | 29 mJ/cm$^2$ | 55.79 nm | Undercut |

TABLE 2

| Composition for forming resist underlayer film | Limit exposure dose | Critical dimensions for pattern collapse | Cross-sectional profile of patterns |
|---|---|---|---|
| Example 7 | 32 mJ/cm$^2$ | 46.42 nm | Straight |
| Example 8 | 33.5 mJ/cm$^2$ | 48.82 nm | Tapered |
| Comparative Example 2 | 30.5 mJ/cm$^2$ | 50.22 nm | Undercut |

TABLE 3

| Composition for forming resist underlayer film | Limit exposure dose | Critical dimensions for pattern collapse | Cross-sectional profile of patterns |
|---|---|---|---|
| Example 9 | 36.5 mJ/cm$^2$ | 43.51 nm | Tapered |
| Example 10 | 38 mJ/cm$^2$ | 43.06 nm | Tapered |
| Comparative Example 3 | 33.5 mJ/cm$^2$ | 45.58 nm | Tapered |

TABLE 4

| Composition for forming resist underlayer film | Limit exposure dose | Critical dimensions for pattern collapse | Cross-sectional profile of patterns |
|---|---|---|---|
| Example 11 | 38 mJ/cm$^2$ | 42.60 nm | Tapered |
| Example 12 | 38 mJ/cm$^2$ | 44.31 nm | Tapered |
| Comparative Example 4 | 33.5 mJ/cm$^2$ | 47.06 nm | Tapered |

As shown in Table 1, in the case where resist underlayer films were formed of the compositions for forming a resist underlayer film in Example 1 to Example 6, the limit exposure dose was higher and the critical dimensions for pattern collapse were smaller compared to the case where the resist underlayer film was formed of the composition for forming a resist underlayer film in Comparative Example 1. Therefore, the resist patterns were prevented from collapsing when fine resist patterns were formed. The resist underlayer films formed of the compositions for forming a resist underlayer film in Example 1 to Example 6 had a tapered (trapezoidal) cross-sectional profile of the resultant resist patterns, while the resist underlayer film formed of the composition for forming a resist underlayer film in Comparative Example 1 had an undercut cross-sectional profile of the resultant resist patterns. As for the tapered profile, the area at which resist patterns are in contact with a resist underlayer film is large, which prevents the resist patterns from collapsing. Similarly, comparison of Example 7 and Example 8 to Comparative Example 2, Example 9 and Example 10 to Comparative Example 3, and Example 11 and Example 12 to Comparative Example 4, shown in Table 2 to Table 4, indicated that each of the resist underlayer films formed of the compositions for forming a resist underlayer film in these examples had higher limit exposure doses and smaller critical dimensions for pattern collapse than those of the resist underlayer films formed of the compositions for forming a resist underlayer film in these comparative examples. In other words, the compositions for forming a resist underlayer film in Example 1 to Example 12 were confirmed to have a useful effect for preventing resist patterns from collapsing.

The embodiments of the present invention are explained above. However, the technical scope of the present invention is not limited to the range described in those embodiments. To the embodiments, various modifications or improvements can be made.

The invention claimed is:

1. A composition for forming a resist underlayer film for lithography, the composition comprising:
    an organic solvent; and
    a polymer having, in a main chain, a repeating structural unit of Formula (1) and at least one structural unit of Formula (4):

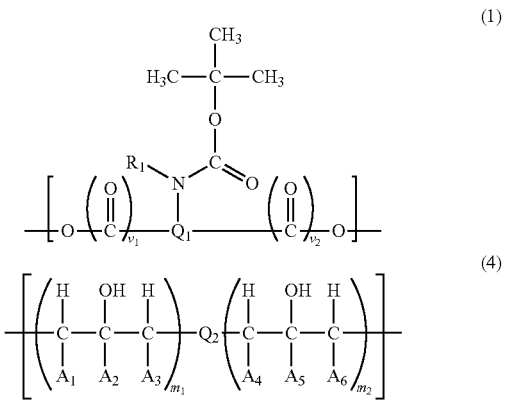

where:
$R_1$ is a hydrogen atom or a methyl group;
$Q_1$ is a group of Formula (2) or Formula (3):

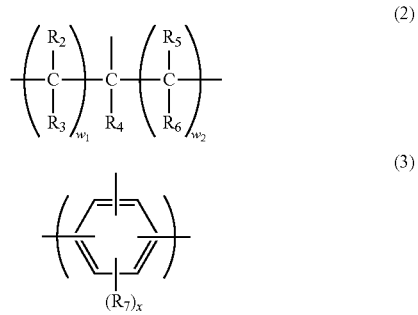

each of $v_1$ and $v_2$ is independently 0 or 1;
each of $A_1$, $A_2$, $A_3$, $A_4$, $A_5$, and $A_6$ is independently a hydrogen atom, a methyl group, or an ethyl group;

$Q_2$ is a divalent organic group of Formula (6):

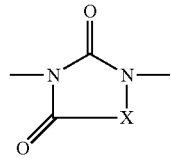
(6)

each of $m_1$ and $m_2$ is independently 0 or 1;
each of $R_2$, $R_3$, $R_5$, and $R_6$ is independently a hydrogen a linear or branched hydrocarbon group having 1 to 4 carbon atoms;
$R_4$ is a hydrogen atom or a methyl group;
$R_7$ is a linear or branched hydrocarbon group having 1 to 6 carbon atoms, a $C_{1-4}$ alkoxy group, a $C_{1-4}$ alkylthio group, a halogen atom, a cyano group, or a nitro group;
$w_1$ is an integer of 0 to 3;
$w_2$ is an integer of 0 to 2;
x is an integer of 0 to 3;
(X is a divalent group of Formula (7) or Formula (8):

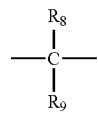
(7)

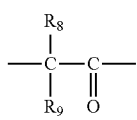
(8)

each of $R_8$ and $R_9$ is independently a hydrogen atom, a $C_{1-6}$ alkyl group, a $C_{3-6}$ alkenyl group, a benzyl group, or a phenyl group, the phenyl group is optionally substituted with at least one selected from the group consisting of $C_{1-6}$ alkyl groups, a halogen atom, $C_{1-6}$ alkoxy groups, a nitro group, a cyano group, and $C_{1-6}$ alkylthio groups; and
$R_8$ and $R_9$ are optionally bonded to each other to form, together with the carbon atom to which $R_8$ and $R_9$ are bonded, a $C_{3-6}$ ring.

2. The composition for forming a resist underlayer film for lithography according to claim 1, further comprising a crosslinking agent and a crosslinking catalyst.

3. A method for fabricating a semiconductor device, the method comprising:
coating a substrate having a subject film with the composition for forming a resist underlayer film according to claim 1,
baking the composition to form a resist underlayer film,
coating the resist underlayer film with a resist,
applying radiation selected from the group consisting of a KrF excimer laser, an ArF excimer laser, extreme ultraviolet light, and an electron beam to the resist-coated substrate,
performing development to form a resist pattern, and
patterning the subject film by dry etching using the resist pattern as a mask.

4. A composition for forming a resist underlayer film for lithography, the composition comprising:

an organic solvent; and
a polymer having, in a main chain, a repeating structural unit of Formula (1) and at least one structural unit of Formula (4):

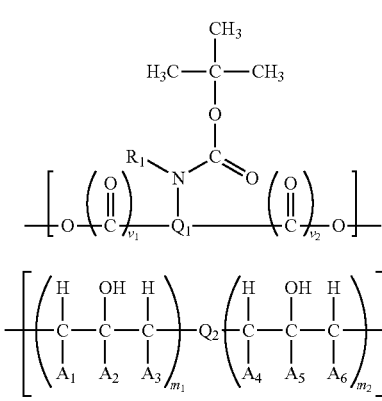
(1)

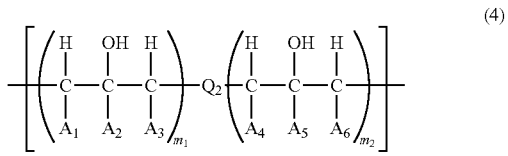
(4)

where:
$R_1$ is a hydrogen atom or a methyl group;
$Q_1$ is a group of Formula (2) or Formula (3):

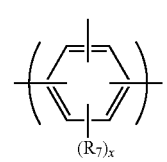
(2)

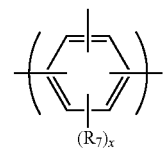
(3)

each of $v_1$ and $v_2$ is independently 0 or 1;
each of $A_1$, $A_2$, $A_3$, $A_4$, $A_5$, and $A_6$ is independently a hydrogen atom, a methyl group, or an ethyl group;
$Q_2$ is a divalent organic group of Formula (9):

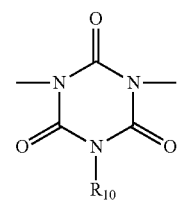
(9)

each of $m_1$ and $m_2$ is independently 0 or 1;
each of $R_2$, $R_3$, $R_5$, and $R_6$ is independently a hydrogen atom or a linear or branched hydrocarbon group having 1 to 4 carbon atoms;
$R_4$ is a hydrogen atom or a methyl group;
$R_7$ is a linear or branched hydrocarbon group having 1 to 6 carbon atoms, a $C_{1-4}$ alkoxy group, a $C_{1-4}$ alkylthio group, a halogen atom, a cyano group, or a nitro group;
$w_1$ is an integer of 0 to 3;
$w_2$ is an integer of 0 to 2;
x is an integer of 0 to 3;

$R_{10}$ is a $C_{1-6}$ alkyl group, a $C_{3-6}$ alkenyl group, a benzyl group, or a phenyl group, and the phenyl group is optionally substituted with at least one selected from the group consisting of $C_{1-6}$ alkyl groups, a halogen atom, $C_{1-6}$ alkoxy groups, a nitro group, a cyano group, and $C_{1-6}$ alkylthio groups.

5. The composition for forming a resist underlayer film for lithography according to claim 4, further comprising a crosslinking agent and a crosslinking catalyst.

6. A method for fabricating a semiconductor device, the method comprising:
coating a substrate having a subject film with the composition for forming a resist underlayer film according to claim 4,
baking the composition to form a resist underlayer film,
coating the resist underlayer film with a resist,
applying radiation selected from the group consisting of a KrF excimer laser, an ArF excimer laser, extreme ultraviolet light, and an electron beam to the resist-coated substrate,
performing development to form a resist pattern, and
patterning the subject film by dry etching using the resist pattern as a mask.

* * * * *